US012796515B2

(12) United States Patent
Scharf et al.

(10) Patent No.: US 12,796,515 B2
(45) Date of Patent: Nov. 10, 2026

(54) ELECTRONIC COMPONENT WITH REDUCED INDUCTANCE

(71) Applicant: Infineon Technologies AG, Neubiberg (DE)

(72) Inventors: Thorsten Scharf, Lappersdorf (DE); Marco Bäßler, Oeversee (DE)

(73) Assignee: Infineon Technologies AG, Neubiberg (DE)

(*) Notice: Subject to any disclaimer, the term of this patent is extended or adjusted under 35 U.S.C. 154(b) by 362 days.

(21) Appl. No.: 18/425,298

(22) Filed: Jan. 29, 2024

(65) Prior Publication Data

US 2025/0246490 A1 Jul. 31, 2025

(51) Int. Cl.
*H10W 70/68* (2026.01)
*H10W 20/43* (2026.01)
*H10W 44/00* (2026.01)

(52) U.S. Cl.
CPC ....... *H10W 70/6875* (2026.01); *H10W 20/43* (2026.01); *H10W 44/501* (2026.01)

(58) Field of Classification Search
CPC ....... H10W 44/501; H10D 12/411–491; H01R 12/7088
See application file for complete search history.

(56) References Cited

U.S. PATENT DOCUMENTS

| | | | | |
|---|---|---|---|---|
| 9,704,831 | B2 * | 7/2017 | Hatai | H10W 70/657 |
| 2020/0091128 | A1 * | 3/2020 | Elsherbini | H10W 70/635 |
| 2021/0183795 | A1 * | 6/2021 | Lee | H10W 44/501 |
| 2021/0408698 | A1 * | 12/2021 | Oblinger | H05K 1/0215 |
| 2024/0087968 | A1 * | 3/2024 | Kimura | H02M 7/003 |
| 2024/0106372 | A1 * | 3/2024 | Gose | B60L 15/007 |
| 2024/0222236 | A1 * | 7/2024 | Tada | H10W 72/30 |

FOREIGN PATENT DOCUMENTS

| | | | | | |
|---|---|---|---|---|---|
| CN | 114008776 | A * | 2/2022 | | H10W 90/00 |
| DE | 102020116673 | B3 | 9/2021 | | |
| EP | 3321959 | A1 * | 5/2018 | | H10W 44/501 |
| JP | 2016119430 | A * | 6/2016 | | H10W 70/658 |
| JP | WO2018142863 | A1 * | 6/2019 | | H10W 90/811 |
| WO | WO-2018109405 | A1 * | 6/2018 | | H10W 44/501 |
| WO | WO-2019064874 | A1 * | 4/2019 | | H10W 90/00 |

* cited by examiner

*Primary Examiner* — Evren Seven
(74) *Attorney, Agent, or Firm* — Murphy, Bilak & Homiller, PLLC

(57) ABSTRACT

An electronic component includes an enclosure, a power circuit, a positive supply terminal and a negative supply terminal, and a metallic body. The power circuit is disposed in the enclosure. The positive supply terminal and negative supply terminal are each exposed from the enclosure. The positive supply terminal and the negative supply terminal are separated from one another by a gap and extend adjacent to each other in a longitudinal direction. The positive supply terminal is electrically coupled to a first terminal of the power circuit and the negative supply terminal is electrically coupled to a second terminal of the power circuit. The metallic body is attached and electrically coupled to one of the positive supply terminal or the negative supply terminal. The metallic body extends along the positive supply terminal and the negative supply terminal in the longitudinal direction.

22 Claims, 7 Drawing Sheets

ELECTRONIC COMPONENT WITH REDUCED INDUCTANCE

BACKGROUND

Demand for electronic components for power applications continues to increase rapidly across a wide range of industries, including automotive, consumer electronics, renewable energy, manufacturing, and medical, among many others. Developments in semiconductor materials such as silicon carbide (SiC) and gallium nitride (GaN) have enabled power electronic components with advantageous features such as smaller footprint, higher voltage and current capabilities, and faster switching speeds. However, requirements for faster switching speeds and higher current in power electronic components are accompanied by an increasing importance on reducing component inductance.

SUMMARY

According to an embodiment of an electronic component, the electronic component comprises: an enclosure; a power circuit disposed in the enclosure; a positive supply terminal and a negative supply terminal each exposed from the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit; and a metallic body attached and electrically coupled to one of the positive supply terminal or the negative supply terminal, wherein the metallic body extends along the positive supply terminal and the negative supply terminal in the longitudinal direction.

According to another embodiment of an electronic component, the electronic component comprises: an enclosure; a power circuit disposed in the enclosure; a positive supply terminal and a negative supply terminal each protruding outward from a first surface of the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit; a first metallic body attached and electrically coupled to the positive supply terminal and extending along at least one face of the positive supply terminal in the longitudinal direction; and a second metallic body attached and electrically coupled to the negative supply terminal and extending along at least one face of the negative supply terminal in the longitudinal direction.

According to another embodiment of an electronic component, the electronic component comprises: an enclosure; a power circuit disposed in the enclosure; a positive supply terminal and a negative supply terminal each protruding outward from a first surface of the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit, wherein each of the positive supply terminal and the negative supply terminal comprises a first main face, a second main face opposite the first main face, and a side face that extends between the first main face and the second main face, wherein the side face of the positive supply terminal and the side face of the negative supply terminal face each other and delimit the gap; and a metallic body extending in the longitudinal direction along at least one of the first main face, the second main face, or the side face of each of the positive supply and the negative supply terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein is an electronic component, for example a power semiconductor component, having two or more supply terminals configured to couple the electronic component to a carrier (e.g., a printed circuit board), module, controller, or another component or device. At least two supply terminals of the electronic component extend adjacent to each other in a longitudinal direction and are separated from one another by a gap, and carry currents in opposing directions (e.g., a positive supply terminal and a negative supply terminal). The electronic component has an associated inductance, a portion of which is associated with each of these adjacent supply terminals. Specifically, changes in current through each adjacent supply terminal produce a change in the associated magnetic field around the respective supply terminal. These changing magnetic fields in turn induce electromotive forces (EMFs) in the supply terminals that oppose the changes in current and may limit the switching speed of the associated electronic component. In the case of adjacent supply terminals carrying currents in opposing directions, as described in the present disclosure, some portions of the magnetic fields associated with the adjacent supply terminals overlap and cancel each other due to being directed in opposing direction. This partial cancelation of the magnetic fields has the effect of reducing the inductance and thus the magnitude of the induced EMFs in the supply terminals, potentially enabling faster switching speeds. Increasing overlap of the magnetic fields, such as by reducing a width of the gap between the supply terminals, may further reduce the inductance associated with the supply terminals. However, manufacturing capabilities may limit the extent to which certain of these dimensions may be reduced without creating other potentially detrimental effects (e.g., creepage lengths, mold cracks), and thus other means of reducing inductance become necessary.

According to an embodiment, a metallic body is attached and electrically coupled to, or, in some examples, placed adjacent to, at least one of the adjacent supply terminals. The metallic body may be oriented such that a width of the gap between adjacent supply terminals is reduced, and/or such that the metallic body effectively increases the surface area between the adjacent supply terminals. In each case, the component inductance may be lowered as a result of increased overlap of opposing magnetic fields generated by the opposing currents in each of the adjacent supply terminals, resulting in a net reduction in magnetic coupling between the supply terminals. Reducing component inductance in this manner may enable faster switching speeds, higher current, and/or provide other performance improvements.

Described next, with reference to the figures, are exemplary embodiments of an electronic component with reduced inductance.

Figure 1:
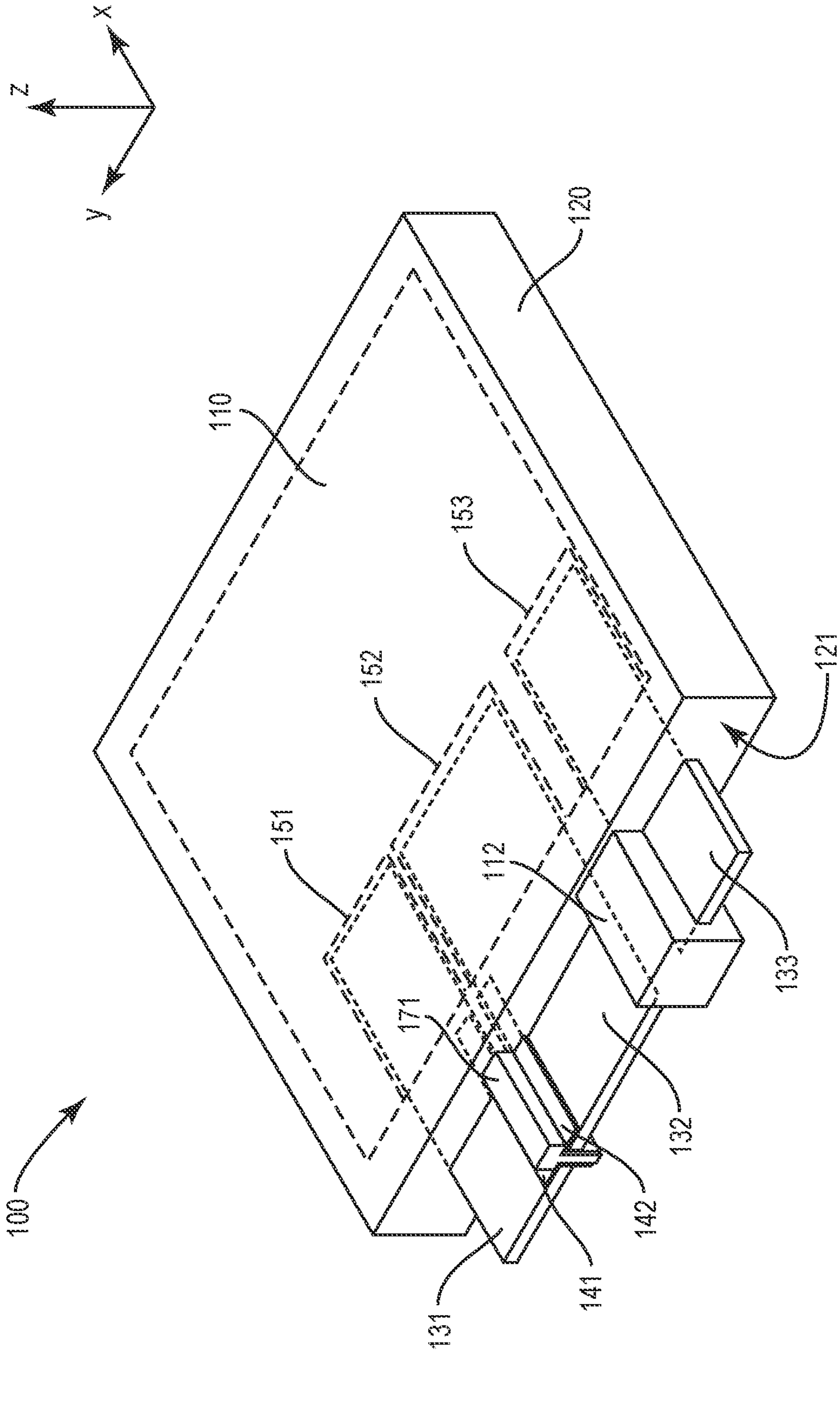
FIG. 1 illustrates a perspective view of a molded electronic component, according to an embodiment.

FIG. 1 illustrates a perspective view of a molded electronic component 100, according to an embodiment.

The electronic component 100 includes a power circuit 110 disposed in an enclosure 120. The power circuit 110 may be all or part of a power electronics circuit such as a DC/AC inverter, a DC/DC converter, an AC/DC converter, a DC/AC converter, an AC/AC converter, a multi-phase inverter, an H-bridge, motor driver, etc. In some examples, the power circuit 110 is a half-bridge or full-bridge circuit.

The electronic component 100 of FIG. 1 is a molded component. That is, the enclosure 120 is a mold compound that encapsulates the power circuit 100. A mold compound is a plastic encapsulant typically formed from an organic resin such as an epoxy resin. The plastic encapsulant may include fillers such as non-melting inorganic materials. Catalysts may be used to accelerate the cure reaction of the organic resin. Other materials such as flame retardants, adhesion promoters, ion traps, stress relievers, colorants, etc. may be added to the plastic encapsulant, as appropriate. The mold compound may be formed by injection molding, compression molding, film-assisted molding (FAM), reaction injection molding (RIM), resin transfer molding (RTM), blow molding, etc.

The electronic component 100 includes supply terminals 131, 132, and 133 configured to provide a means of electrical contact between the power circuit 110 and an external component or device (e.g., a carrier such as a printed circuit board, a module, a controller, cables, etc.). The electronic component 100 may include one or more additional component terminals that are not illustrated (e.g., a control terminal for a gate). Adjacent supply terminals, that is, the supply terminals 131 and 132 and the supply terminals 132 and 133, extend adjacent to each other in a longitudinal direction x. The supply terminals 131, 132, and 133 are each partly exposed from the enclosure 120 to enable external contact. In the example of the electronic component 100, the supply terminals 131, 132, and 133 each protrude outward from a first surface 121 of the enclosure 120. In other examples, one or more of the supply terminals 131, 132, or 133 may be flush with or recessed from one or more surfaces of the enclosure 120. Other orientations of supply terminals 131, 132, and 133 are contemplated.

Each of the supply terminals 131, 132, and 133 may be a positive terminal, a negative terminal, or a ground terminal. However, at least two adjacent supply terminals of the electronic component 100 are load terminals that have opposite polarities and thus carry current in opposing directions (e.g., the supply terminal 131 is positive and the supply terminal 132 is negative; the supply terminal 131 is negative and the supply terminal 132 is positive; the supply terminals 131 and 133 are positive and the supply terminal 132 is negative; the supply terminals 131 and 133 are negative and the supply terminal 132 is positive). As used herein, the terms "positive terminal" and "negative terminal" may also include a ground terminal when describing a polarity of a respective supply terminal relative to that of an adjacent supply terminal having opposite polarity. The supply terminals 131, 132, and 133 are electrically coupled to the terminals 151, 152, and 153, respectively, of the power circuit 110. In examples where the power circuit 110 includes one or more transistors (e.g. MOSFET(s), IGBT(s), a half bridge or full bridge circuit), one or more of the supply terminals 131, 132, and 133 may be a source, emitter, drain, or collector terminal.

For the purposes of illustration hereafter, the adjacent supply terminals 131 and 132 will be described, with the supply terminal 131 being a load terminal having a first polarity (e.g., positive) and the supply terminal 132 being a load terminal having a second, opposite polarity (e.g., negative). However, the description hereafter may, in addition to or alternatively, apply to adjacent the supply terminals 132 and 133 and to other polarity configurations of the supply terminals 131 and 132. For example, a configuration similar to the one described below may be present between the supply terminals 132 and 133, with the configuration enclosed in a body 112 of mold compound.

According to an embodiment, the electronic component 100 includes a first metallic body 141 that extends along the supply terminal 131 and the supply terminal 132 in the longitudinal direction x. In some examples, the first metallic body 141 is attached and electrically coupled to the supply terminal 131. In the example of the electronic component 100, the first metallic body 141 extends along the supply terminal 131 and the supply terminal 132 in the longitudinal direction x outside the enclosure 120. In other examples, the first metallic body 141 may be enclosed within the enclosure 120, such as in a body of mold compound (e.g., like the body 112) that protrudes from the enclosure 120.

The electronic component 100 may further include a second metallic body 142 that is separate from the first metallic body 141. The second metallic body 142 extends along the supply terminal 131 and the supply terminal 132 in the longitudinal direction x and, in some examples, is attached and electrically coupled to the supply terminal 132. The second metallic body 142 may extend along the supply terminal 131 and the supply terminal 132 in the longitudinal direction x outside the enclosure 120 or may be enclosed within the enclosure 120, such as in a body of mold compound (e.g., like the body 112) that protrudes from the enclosure 120.

Examples of the first metallic body 141 and the second metallic body 142 include metallic sheets, brackets, blocks, clips, and foil, among others. The first metallic body 141 may include the same or similar material(s), shape, structure, etc. as the second metallic body 142, or may be different than the first metallic body 141.

The electronic component 100 may include an electrically insulative material 171 disposed between the first metallic body 141 and the second metallic body 142. In examples that do not include the second metallic body 142, the electrically insulative material 171 may be disposed between the first metallic body 141 and the supply terminal 132. In some examples, the electrically insulative material 171 includes a polymeric material (e.g., polyimide), a ceramic, a glassy material, or a blend of one or more of these and/or another material. The electrically insulative material 171 may include a portion of the mold compound of the enclosure 120 or may comprise the same material as the mold compound of the enclosure 120 but be separate from the enclosure 120. In some examples, the electrically insulative material 171 is a tape, such as a double-sided polyimide tape or another suitable tape. The electrically insulative material 171 may have properties such as high elongation-to-break (e.g., high ductility), high insulation strength, good adhesion to the metallic bodies 141 and 142, and/or low brittleness, among other properties. An electrically insulative material that is less brittle than the mold compound of the enclosure 120 may be used to reduce the risk of cracking due to narrow dimensions between the supply terminals 131 and 132. In some instances, part or all of the electrically insulative material 171 may be enclosed in or extend into the enclosure 120.

Figure 2:
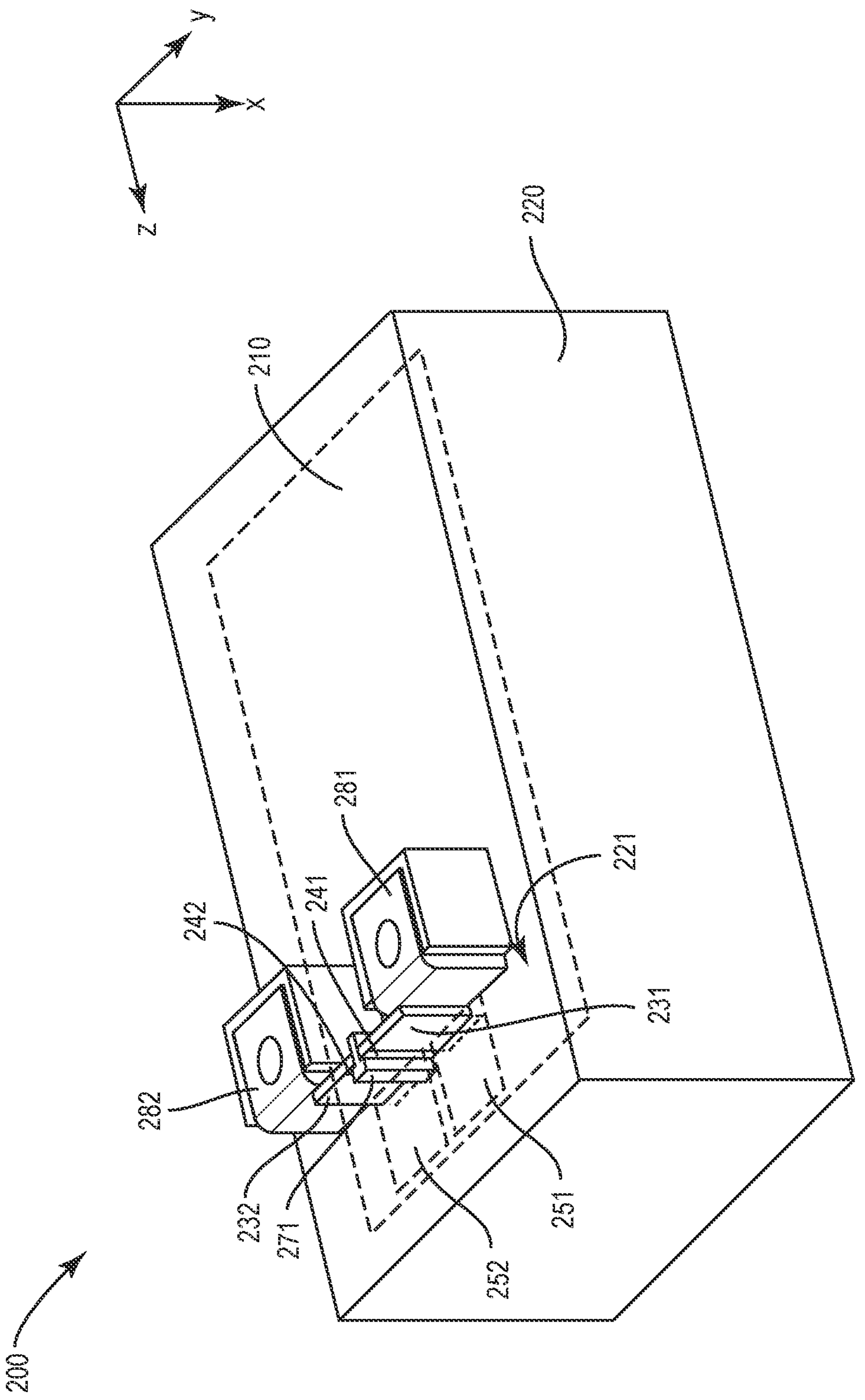
FIG. 2 illustrates a perspective view of a frame-based electronic component, according to an embodiment.

FIG. 2 illustrates a perspective view of a frame-based electronic component 200, according to an embodiment.

The electronic component 200 includes a power circuit 210 disposed in an enclosure 220. The power circuit 210 may be all or part of a power electronics circuit such as a DC/AC inverter, a DC/DC converter, an AC/DC converter, a DC/AC converter, an AC/AC converter, a multi-phase inverter, an H-bridge, motor driver, etc. In some examples, the power circuit 210 is a half-bridge or full-bridge circuit.

The electronic component 200 of FIG. 2 is a frame component. That is, the enclosure 220 is an electrically insulative frame attached to a substrate (e.g., an insulated metal substrate (IMS), a DCB (direct copper bonded) substrate, an AMB (active metal brazed), etc.) and laterally enclosing the power circuit 210. The enclosure 220 may have a lid.

The electronic component 200 includes supply terminals 231 and 232 configured to provide a means of electrical contact between the power circuit 210 and another component or device (e.g., a carrier such as a printed circuit board, a module, a controller, cables, etc.). The electronic component 200 may include one or more additional component terminals that are not illustrated (e.g., a control terminal for a gate). The supply terminals 231 and 232 extend adjacent to each other in a longitudinal direction x. The supply terminals 231 and 232 are each exposed from the enclosure 220. In the example of the electronic component 200, the supply terminals 231 and 232 each protrude outward from a first surface 221 of the enclosure 220. The supply terminals 231 and 232 of this example are attached and electrically coupled to power tabs 281 and 282, respectively. In other examples, one or both of the supply terminals 231 or 232 may be flush with or recessed from one or more surfaces of the enclosure 220. Other orientations of the supply terminals 231 and 232 are contemplated.

Each of the supply terminals 231 and 232 are load terminals and may be a positive terminal or a negative terminal. However, the supply terminals 231 and 232 have opposite polarities and thus carry current in opposing directions (e.g., the supply terminal 231 is positive and the supply terminal 232 is negative; the supply terminal 231 is negative and the supply terminal 232 is positive). As noted above, the terms "positive terminal" and "negative terminal" may also include a ground terminal when describing a polarity of a respective supply terminal relative to that of an adjacent supply terminal having opposite polarity. The supply terminals 231 and 232 are electrically coupled to terminals 251 and 252, respectively, of the power circuit 210. In examples where the power circuit 210 includes one or more transistors (e.g. MOSFET(s), IGBT(s), a half bridge or full bridge circuit), one or both of the supply terminals 231 or 232 may be a source, emitter, drain, or collector terminal.

According to an embodiment, the electronic component 200 includes a first metallic body 241 that extends along the supply terminal 231 and the supply terminal 232 in the longitudinal direction x. In some examples, the first metallic body 241 is attached and electrically coupled to the supply terminal 231. In the example of the electronic component 200, the first metallic body 241 extends along the supply terminal 231 and the supply terminal 232 in the longitudinal direction x outside the enclosure 220. In other examples, the first metallic body 241 may be enclosed within the enclosure 220, such as in an extension or body (e.g., of an insulating material) that protrudes from the first surface 221 of the enclosure 220.

The electronic component 200 may further include a second metallic body 242 that is separate from the first metallic body 241. The second metallic body 242 extends along the supply terminal 231 and the supply terminal 232 in the longitudinal direction x and, in some examples, is attached and electrically coupled to the supply terminal 232. The second metallic body 242 may extend along the supply terminal 231 and the supply terminal 232 in the longitudinal direction x outside the enclosure 220 or may be enclosed within the enclosure 220, such as in an extension or body (e.g., of an insulating material) that protrudes from the first surface 221 of the enclosure 220.

Examples of the first metallic body 241 and the second metallic body 242 include metallic sheets, brackets, blocks, clips, and foil, among others. The first metallic body 241 may include the same or similar material(s), shape, structure, etc. as the second metallic body 242, or may be different than the first metallic body 241.

The electronic component 200 may include an electrically insulative material 271 disposed between the first metallic body 241 and the second metallic body 242. In examples that do not include the second metallic body 242, the electrically insulative material 271 may be disposed between the first metallic body 241 and the supply terminal 232. In some examples, the electrically insulative material 271 includes a polymeric material (e.g., polyimide). In some examples, the electrically insulative material 271 is a tape, such as a double-sided polyimide tape. The electrically insulative material 271 may have properties such as high elongation-to-break (e.g., high ductility), high insulation strength, good adhesion to the metallic bodies 241 and 242, and/or low brittleness, among other properties. An electrically insulative material having low brittleness may be used to reduce the risk of cracking due to narrow dimensions between the supply terminals 231 and 232.

Figure 3:
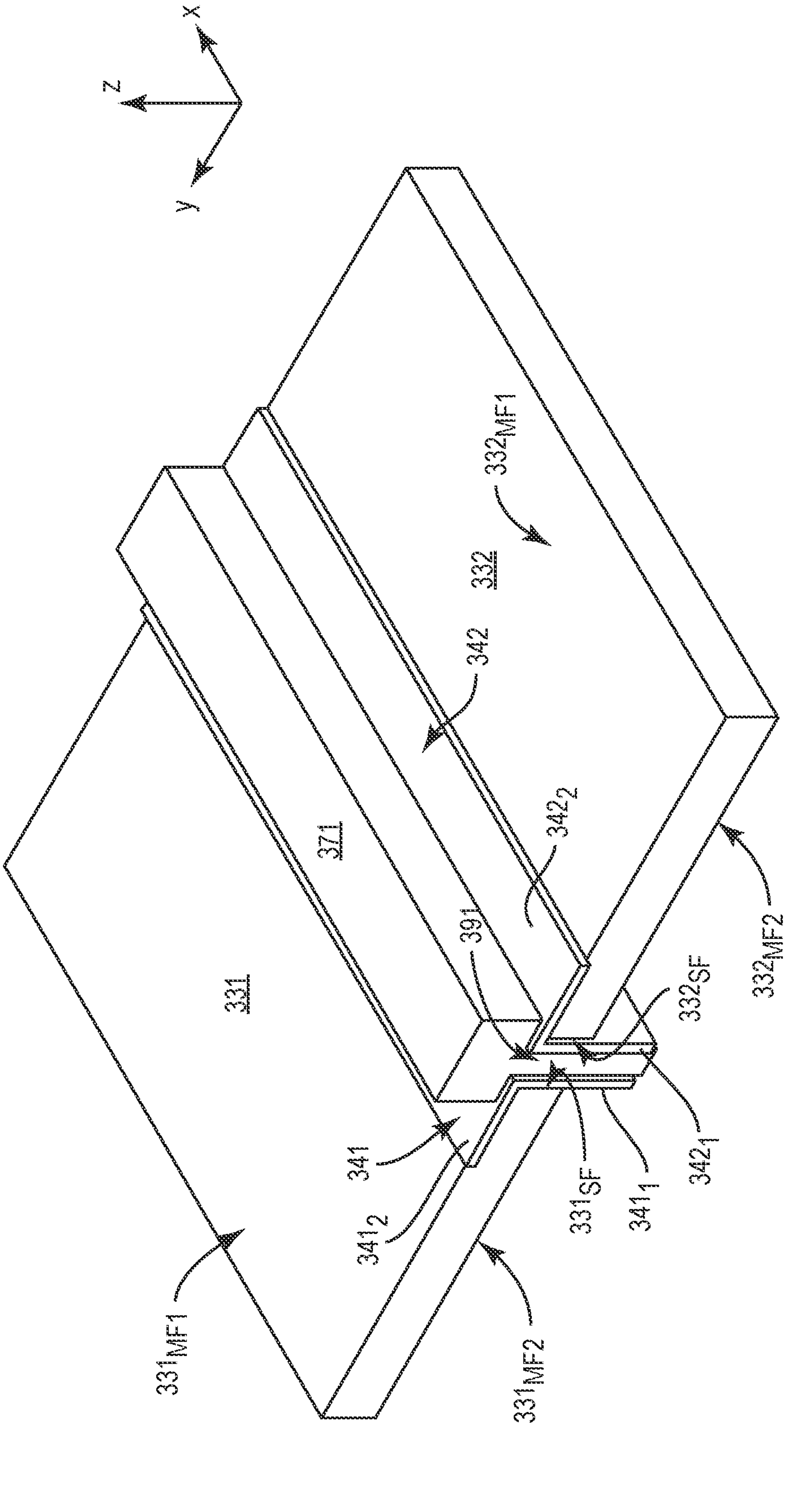
FIG. 3 illustrates a perspective view of supply terminals, metallic bodies, and an electrically insulative material of an electronic component, according to an embodiment.

FIG. 3 illustrates a perspective view of supply terminals 331 and 332, metallic bodies 341 and 342, and an electrically insulative material 371 of an electronic component, according to an embodiment. The supply terminals 331 and 332, the first and second metallic bodies 341 and 342, and the electrically insulative material 371 illustrate one example configuration of the supply terminals 131 and 132, the first and second metallic bodies 141 and 142, and the electrically insulative material 171, respectively, of FIG. 1, and of the supply terminals 231 and 232, the first and second metallic bodies 241 and 242, and the electrically insulative material 272, respectively, of FIG. 2.

The supply terminal 331 and the supply terminal 332 are separated from one another by a gap 391. Each of the supply terminal 331 and the supply terminal 332 includes a first main face (331$_{MF1}$ and 332$_{MF1}$, respectively), a second main face opposite the first main face (331$_{MF2}$ and 332$_{MF2}$, respectively), and a side face (331$_{SF}$ and 332$_{SF}$, respectively). The side face 331$_{SF}$ of the supply terminal 331 extends between the first main face 331$_{MF1}$ and the second main face 331$_{MF2}$. The side face 332$_{SF}$ of the supply terminal 332 extends between the first main face 332$_{MF1}$ and the second main face 332$_{MF2}$. The side faces 331$_{SF}$ and 332$_{SF}$ each partly delimit the gap 391. The side face 331$_{SF}$ of the supply terminal 331 and the side face 332$_{SF}$ of the supply terminal 332 face each other.

The first metallic body 341 is attached and electrically coupled to the supply terminal 331. The first metallic body 341 extends along at least one of the first main face 331$_{MF1}$, the second main face 331$_{MF2}$, or the side face 331$_{SF}$ of the supply terminal 331, for example in the longitudinal direction x. In the example of FIG. 3, the first metallic body 341 extends from within the gap 391 along the side face 331$_{SF}$ and beyond the first main face 331$_{MF1}$ and the second main face 331$_{MF2}$. Specifically, a first part 341$_1$ of the first metallic body 341 extends into the gap 391 along the side face 331$_{SF}$ of the supply terminal 331. A second part 341$_2$ of the first metallic body 341 extends along the first main face 331$_{MF1}$ and adjoins the first part 341$_1$ of the first metallic body 341. Additionally, or alternatively, a part of the first metallic body 341 may extend along the second main face 331$_{MF2}$ and adjoin the first part 341$_1$. In some examples, the first metallic body 341 may only extend along one of the first main face 331$_{MF1}$, the second main face 331$_{MF2}$, or the side face 331$_{SF}$ of the supply terminal 331.

The second metallic body 342 is attached and electrically coupled to the supply terminal 332. The second metallic body 342 extends along at least one of the first main face 332$_{MF1}$, the second main face 332$_{MF2}$, or the side face 332$_{SF}$ of the supply terminal 332, for example in the longitudinal direction x. In the example of FIG. 3, the second metallic body 342 extends from within the gap 391 along the side face 332$_{SF}$ and beyond the first main face 332$_{MF1}$ and the second main face 332$_{MF2}$. Specifically, a first part 342$_1$ of the second metallic body 342 extends into the gap 391 along the side face 332$_{SF}$ of the supply terminal 332. A second part 342$_2$ of the second metallic body 342 extends along the first main face 332$_{MF1}$ and adjoins the first part 342$_1$ of the second metallic body 342. Additionally, or alternatively, a part of the second metallic body 342 may extend along the second main face 332$_{MF2}$ and adjoin the first part 342$_1$. In some examples, the second metallic body 342 may only extend along one of the first main face 332$_{MF1}$, the second main face 332$_{MF2}$, or the side face 332$_{SF}$ of the supply terminal 332.

The electrically insulative material 371 of FIG. 3 extends into the gap 391. In this example, the electrically insulative material 371 is disposed between the first metallic body 341 and the second metallic body 342 in the gap 391. The electrically insulative material 371 extends beyond the second main faces 331$_{MF2}$ and 332$_{MF2}$ of the supply terminals 331 and 332, respectively. The electrically insulative material 371 extends along the second parts 341$_2$ and 342$_2$ of the first metallic body 341 and the second metallic body 342, respectively.

Figure 4:
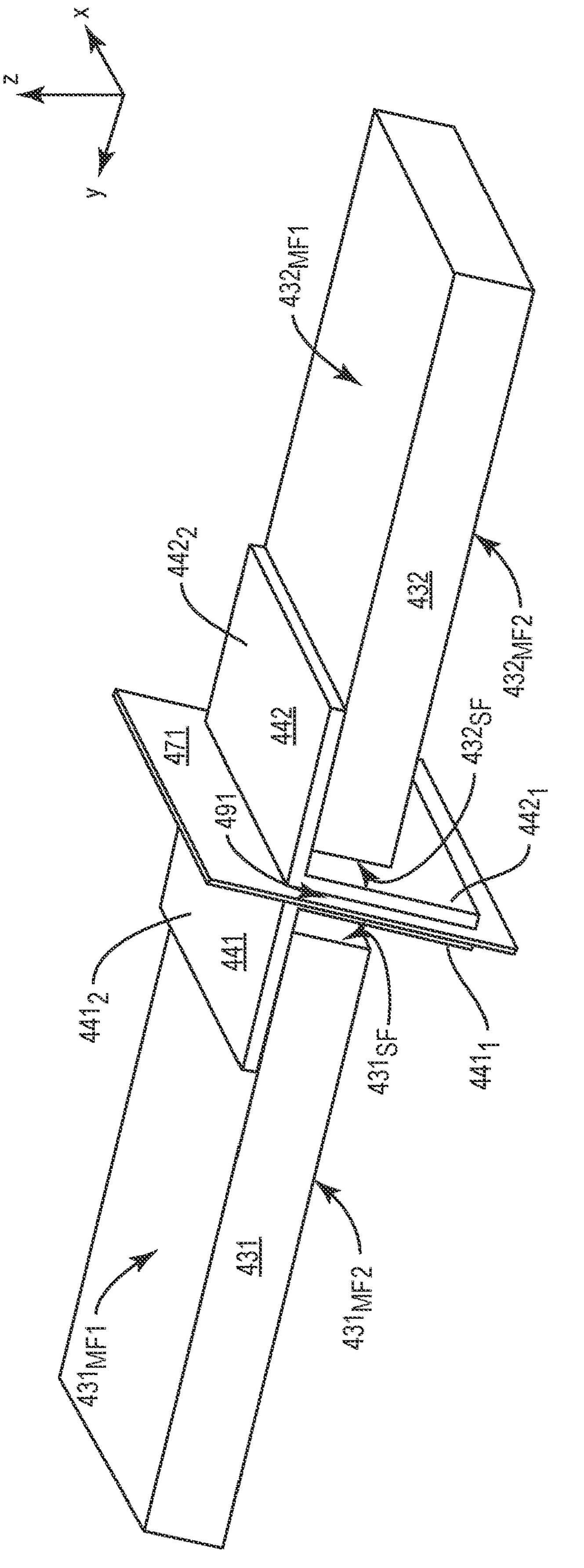
FIG. 4 illustrates a perspective view of supply terminals, metallic bodies, and an electrically insulative material of an electronic component, according to an embodiment.

FIG. 4 illustrates a perspective view of supply terminals 431 and 432, metallic bodies 441 and 442, and an electrically insulative material 471 of an electronic component, according to an embodiment. The supply terminals 431 and 432, the first and second metallic bodies 441 and 442, and the electrically insulative material 471 illustrate one example of the supply terminals 131 and 132, the first and second metallic bodies 141 and 142, and the electrically insulative material 171, respectively, of FIG. 1, and of the supply terminals 231 and 232, the first and second metallic bodies 241 and 242, and the electrically insulative material 272, respectively, of FIG. 2.

The supply terminal 431 and the supply terminal 432 are separated from one another by a gap 491. Each of the supply terminal 431 and the supply terminal 432 includes a first main face (431$_{MF1}$ and 432$_{MF1}$, respectively), a second main face opposite the first main face (431$_{MF2}$ and 432$_{MF2}$, respectively), and a side face (431$_{SF}$ and 432$_{SF}$, respectively). The side face 431$_{SF}$ of the supply terminal 431 extends between the first main face 431$_{MF1}$ and the second main face 431$_{MF2}$. The side face 432$_{SF}$ of the supply terminal 432 extends between the first main face 432$_{MF1}$ and the second main face 432$_{MF2}$. The side faces 431$_{SF}$ and 432$_{SF}$ each partly delimit the gap 491. The side face 431$_{SF}$ of the supply terminal 431 and the side face 432$_{SF}$ of the supply terminal 432 face each other.

The first metallic body 441 is attached and electrically coupled to the supply terminal 431. The first metallic body 441 extends along at least one of the first main face 431$_{MF1}$, the second main face 431$_{MF2}$, or the side face 431$_{SF}$ of the supply terminal 431, for example in the longitudinal direction x. In the example of FIG. 4, the first metallic body 441 extends from within the gap 491 along the side face 431$_{SF}$ and beyond the first main face 431$_{MF1}$ and the second main face 431$_{MF2}$. Specifically, a first part 441$_1$ of the first metallic body 441 extends into the gap 491 along the side face 431$_{SF}$ of the supply terminal 431. In this example, the first part 441$_1$ is separated from the side face 431$_{SF}$ by a gap, although arrangements in which the first part 441$_1$ is in contact with the side face 431*SF* are contemplated. A second part 441$_2$ of the first metallic body 441 extends along the first main face 431$_{MF1}$ and adjoins the first part 441$_1$ of the first metallic body 441. Additionally, or alternatively, a part of the first metallic body 441 may extend along the second main face 431$_{MF2}$ and adjoin the first part 441$_1$. In some examples, the first metallic body 441 may only extend along one of the first main face 431$_{MF1}$, the second main face 431$_{MF2}$, or the side face 431$_{SF}$ of the supply terminal 431.

The second metallic body 442 is attached and electrically coupled to the supply terminal 432. The second metallic body 442 extends along at least one of the first main face 432$_{MF1}$, the second main face 432$_{MF2}$, or the side face 432$_{SF}$ of the supply terminal 432, for example in the longitudinal direction x. In the example of FIG. 4, the second metallic body 442 extends from within the gap 491 along the side face 432$_{SF}$ and beyond the first main face 432$_{MF1}$ and the second main face 432$_{MF2}$. Specifically, a first part 442$_1$ of the second metallic body 442 extends into the gap 491 along the side face 432$_{SF}$ of the supply terminal 432. In this example, the first part 442$_1$ is separated from the side face 432$_{SF}$ by a gap, although arrangements in which the first part 442$_1$ is in contact with the side face 432$_{SF}$ are contemplated. A second part 442$_2$ of the second metallic body 442 extends along the first main face 432$_{MF1}$ and adjoins the first part 442$_1$ of the second metallic body 442. Additionally, or alternatively, a part of the second metallic body 442 may extend along the second main face 432$_{MF2}$ and adjoin the first part $442_1$. In some examples, the second metallic body 442 may only extend along one of the first main face $432_{MF1}$, the second main face $432_{MF2}$, or the side face $432_{SF}$ of the supply terminal 432.

The electrically insulative material 471 of FIG. 4 extends into the gap 491. In this example, the electrically insulative material 471 is disposed between the first metallic body 441 and the second metallic body 442 in gap 491. The electrically insulative material 471 extends beyond the second main faces $431_{MF2}$ and $432_{MF2}$ of the supply terminals 431 and 432, respectively.

Figure 5A:
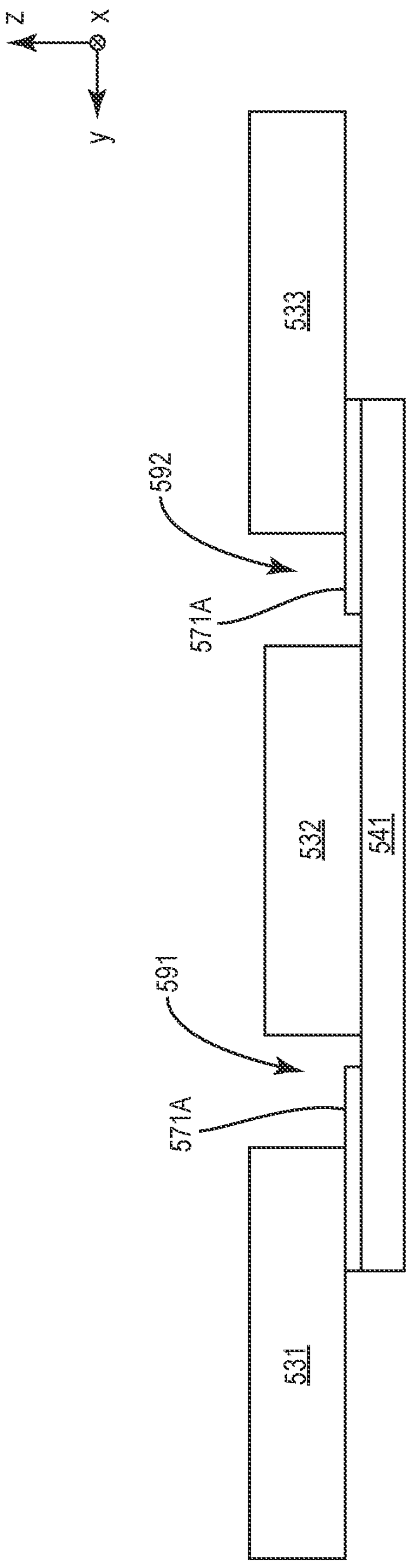
FIG. 5A illustrates a side view of supply terminals, a metallic body, and an electrically insulative material of an electronic component, according to an embodiment.

FIG. 5A illustrates a side view of supply terminals 531, 532, and 533, a metallic body 541, and an electrically insulative material 571A of an electronic component, according to an embodiment. The view illustrated in FIG. 5A is along the longitudinal direction x. The supply terminals 531, 532, and 533, the metallic body 541, and the electrically insulative material 571A illustrate one example of the supply terminals 131, 132, and 133, the first metallic body 141, and the electrically insulative material 171, respectively, of FIG. 1. The supply terminals 531 and 532, and 532 and 533, respectively, illustrate examples of the supply terminals 231 and 232, respectively, of FIG. 2. The metallic body 541 and the electrically insulative material 571A illustrate one example of the first metallic body 241 and the electrically insulative material 271, respectively, of FIG. 2.

The supply terminal 531 and the supply terminal 532 are separated from one another by a gap 591. The supply terminal 532 and the supply terminal 533 are separated from one another by a gap 592. The metallic body 541 of this example is disposed entirely below the supply terminals 531, 532, and 533. Alternatively, or additionally, the metallic body 541 or another metallic body may be disposed entirely above the supply terminals 531, 532, and 533. The metallic body 541 is attached and electrically coupled to the supply terminal 532 and bridges the gaps 591 and 592. The metallic body 541 is electrically insulated from the supply terminals 531 and 533 by the electrically insulative material 571A.

Figure 5B:
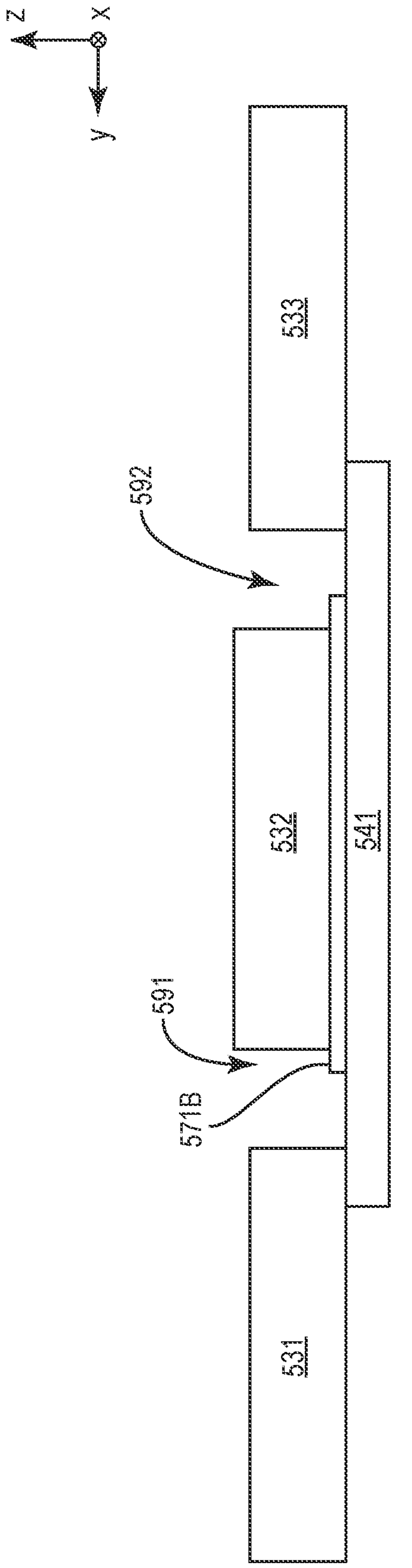
FIG. 5B illustrates a side view of supply terminals, a metallic body, and an electrically insulative material of an electronic component, according to an embodiment.

FIG. 5B illustrates a side view of supply terminals 531, 532, and 533, a metallic body 541, and an electrically insulative material 571B of an electronic component, according to an embodiment. FIG. 5B illustrates an alternative arrangement of the supply terminals 531, 532, and 533, and the metallic body 541 of FIG. 5A, as viewed along the longitudinal direction x. In this example, the metallic body 541 is attached and electrically coupled to the supply terminals 531 and 533 and is electrically insulated from the supply terminal 532 by the electrically insulative material 571B.

Figure 6:
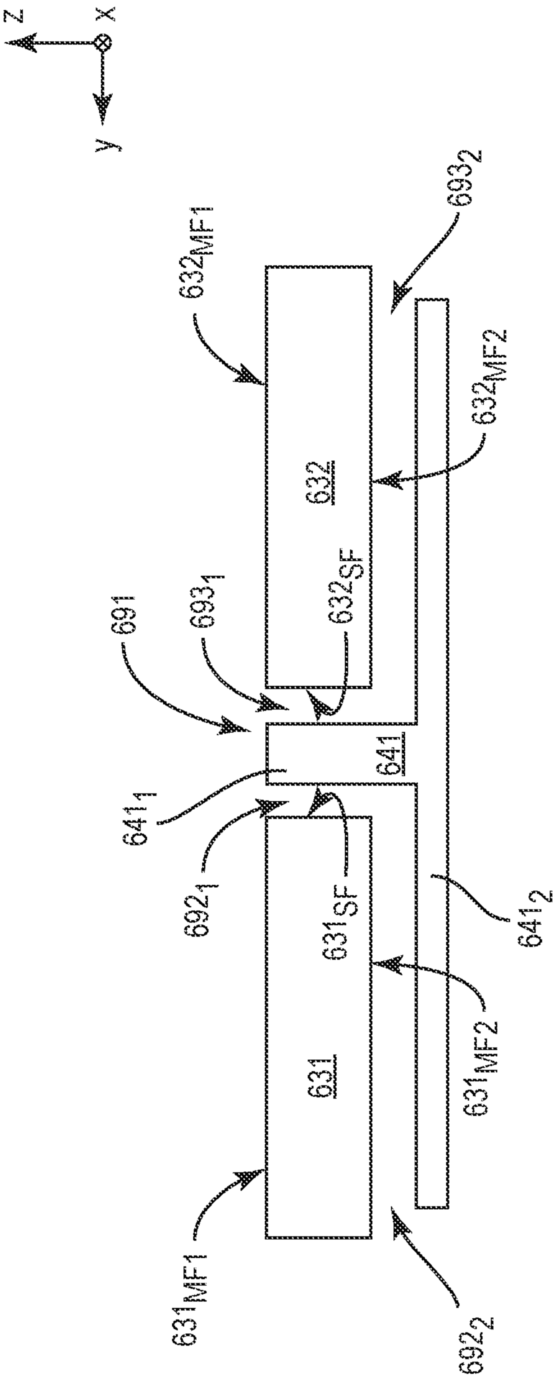
FIG. 6 illustrates a side view of supply terminals and a metallic body of an electronic component, according to an embodiment.

FIG. 6 illustrates a side view of supply terminals 631 and 632 and a metallic body 641 of an electronic component, according to an embodiment. Supply terminals 631 and 632 and metallic body 641 illustrate one example of the supply terminals 131 and 132 and the first metallic body 141, respectively, of FIG. 1, and of the supply terminals 231 and 232 and the first metallic body 241, respectively, of FIG. 2.

The supply terminal 631 and the supply terminal 632 are separated from one another by a gap 691. Each of the supply terminal 631 and the supply terminal 632 includes a first main face ($631_{MF1}$ and $632_{MF1}$, respectively), a second main face opposite the first main face ($631_{MF2}$ and $632_{MF2}$, respectively), and a side face ($631_{SF}$ and $632_{SF}$, respectively). The side face $631_{SF}$ of the supply terminal 631 extends between the first main face $631_{MF1}$ and the second main face $631_{MF2}$. The side face $632_{SF}$ of the supply terminal 632 extends between the first main face $632_{MF1}$ and the second main face $632_{MF2}$. The side faces $631_{SF}$ and $632_{SF}$ each partly delimit the gap 691. The side face $631_{SF}$ of the supply terminal 631 and the side face $632_{SF}$ of the supply terminal 632 face each other.

The metallic body 641 extends along at least one of the first main face ($631_{MF1}$ or $632_{MF1}$), the second main face ($631_{MF2}$, or $632_{MF2}$), or the side face ($631_{SF}$ or $632_{SF}$) of each of the supply terminal 631 and the supply terminal 632, for example in the longitudinal direction x. In the example of FIG. 6, a first part $641_1$ of the metallic body 641 extends into the gap 691 between and along the side face $631_{SF}$ of the supply terminal 631 and the side face $632_{SF}$ of the supply terminal 632. A second part $641_2$ of the metallic body 641 extends along the second main faces $631_{MF2}$ and $632_{MF2}$ of the supply terminals 631 and 632, respectively, and adjoins the first part $641_1$ of the metallic body 641. Additionally, or alternatively, a part of the metallic body 641 may extend along only one of the second main faces $631_{MF2}$ and $632_{MF2}$ of the supply terminals 631 and 632, respectively, and/or along one or both of the first main faces $631_{MF1}$ and $632_{MF1}$ of the supply terminals 631 and 632, respectively.

In this example, the metallic body 641 is separated from the supply terminals 631 and 632. Specifically, the first part $641_1$ of the metallic body 641 is separated from the side faces $631_{SF}$ and $632_{SF}$ by gaps $692_1$ and $693_1$, respectively, and the second part $641_2$ of metallic body 641 is separated from the second main faces $631_{MF2}$ and $632_{MF2}$ of the supply terminals 631 and 632 by gaps $692_2$ and $693_2$, respectively. Other arrangements of all or parts of the metallic body 641 relative to the supply terminals 631 and 632 are contemplated.

Although the present disclosure is not so limited, the following numbered examples demonstrate one or more aspects of the disclosure.

Example 1. An electronic component, comprising: an enclosure; a power circuit disposed in the enclosure; a positive supply terminal and a negative supply terminal each exposed from the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit; and a metallic body attached and electrically coupled to one of the positive supply terminal or the negative supply terminal, wherein the metallic body extends along the positive supply terminal and the negative supply terminal in the longitudinal direction.

Example 2. The electronic component of example 1, further comprising an electrically insulative material disposed between the metallic body and the one of the positive supply terminal or the negative supply terminal that the metallic body is not attached and electrically coupled to.

Example 3. The electronic component of example 2, wherein the electrically insulative material comprises a polymeric material, a ceramic, a glassy material, or a blend of one or more of these.

Example 4. The electronic component of any of examples 2 or 3, wherein the enclosure is a mold compound that encapsulates the power circuit, and wherein the electrically insulative material is less brittle than the mold compound.

Example 5. The electronic component of any of examples 2 through 4, wherein the electrically insulative material extends into the gap.

Example 6. The electronic component of any of examples 1 through 5, wherein the supply terminal to which the metallic body is attached and electrically coupled comprises:

a first main face; a second main face opposite the first main face; and a side face that extends between the first main face and the second main face and partly delimits the gap, and wherein the metallic body extends along at least one of the first main face, the second main face, or the side face.

Example 7. The electronic component of any of examples 1 through 6, wherein the metallic body extends into the gap along the side face.

Example 8. The electronic component of any of examples 1 through 7, wherein the metallic body extends from within the gap along the side face and beyond at least one of the first main face or the second main face.

Example 9. The electronic component of any of examples 1 through 8, wherein a first part of the metallic body extends along one of the first main face, the second main face, or the side face, and wherein a second part of the metallic body extends along a different one of the first main face, the second main face, or the side face and adjoins the first part of the metallic body.

Example 10. The electronic component of example 9, wherein the first part of the metallic body extends into the gap along the side face, and wherein the second part of the metallic body extends along the first main face or the second main face and adjoins the first part of the metallic body.

Example 11. The electronic component of any of examples 1 through 6 or 9, wherein the metallic body is disposed entirely above or below the positive supply terminal and the negative supply terminal, bridges the gap, and is electrically insulated from the one of the positive supply terminal or the negative supply terminal that the metallic body is not attached and electrically coupled to.

Example 12. The electronic component of any of examples 1 through 11, further comprising: an additional metallic body separate from the metallic body, wherein the metallic body is attached and electrically coupled to the positive supply terminal, wherein the additional metallic body is attached and electrically coupled to the negative supply terminal, and wherein the additional metallic body extends along the positive supply terminal and the negative supply terminal in the longitudinal direction.

Example 13. The electronic component of any of examples 1 through 12, further comprising: an electrically insulative material disposed between the metallic body and the additional metallic body in the gap.

Example 14. The electronic component of any of examples 1 through 13, wherein each of the positive supply terminal and the negative supply terminal comprises: a first main face; a second main face opposite the first main face; and a side face that extends between the first main face and the second main face and partly delimits the gap, wherein the side face of the positive supply terminal and the side face of the negative supply terminal face each other, wherein the metallic body extends along at least one of the first main face of the positive supply terminal, the second main face of the positive supply terminal, or the side face of the positive supply terminal, and wherein the additional metallic body extends along at least one of the first main face of the negative supply terminal, the second main face of the negative supply terminal, or the side face of the negative supply terminal.

Example 15. The electronic component of any of examples 1 through 14, wherein at least a part of the metallic body extends into the gap along the side face of the positive supply terminal, and wherein at least a part of the additional metallic body extends into the gap along the side face of the negative supply terminal.

Example 16. The packaged electronic component of any of examples 1 through 15, wherein the power circuit is a half-bridge or full-bridge circuit.

Example 17. The packaged electronic component of any of examples 1 through 16, wherein the metallic body extends along the positive supply terminal and the negative supply terminal in the longitudinal direction outside the enclosure.

Example 18. An electronic component, comprising: an enclosure; a power circuit disposed in the enclosure; a positive supply terminal and a negative supply terminal each protruding outward from a first surface of the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit; a first metallic body attached and electrically coupled to the positive supply terminal and extending along at least one face of the positive supply terminal in the longitudinal direction; and a second metallic body attached and electrically coupled to the negative supply terminal and extending along at least one face of the negative supply terminal in the longitudinal direction.

Example 19. The electronic component of example 18, further comprising an electrically insulative material disposed between the first metallic body and the second metallic body in the gap.

Example 20. The electronic component of example 18 or 19, wherein each of the first metallic body and the second metallic body extends into the gap.

Example 21. An electronic component, comprising: an enclosure; a power circuit disposed in the enclosure; a positive supply terminal and a negative supply terminal each protruding outward from a first surface of the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit, wherein each of the positive supply terminal and the negative supply terminal comprises a first main face, a second main face opposite the first main face, and a side face that extends between the first main face and the second main face, wherein the side face of the positive supply terminal and the side face of the negative supply terminal face each other and delimit the gap; and a metallic body extending in the longitudinal direction along at least one of the first main face, the second main face, or the side face of each of the positive supply and the negative supply terminal.

Example 22. The electronic component of example 21, wherein the metallic body extends into the gap between and along the side face of the positive supply terminal and the side face of the negative supply terminal.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
- an enclosure;
- a power circuit disposed in the enclosure;
- a positive supply terminal and a negative supply terminal each exposed from the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit; and
- a metallic body attached and electrically coupled to one of the positive supply terminal or the negative supply terminal,
- wherein the metallic body extends along the positive supply terminal and the negative supply terminal in the longitudinal direction.

2. The electronic component of claim 1, further comprising an electrically insulative material disposed between the metallic body and the one of the positive supply terminal or the negative supply terminal that the metallic body is not attached and electrically coupled to.

3. The electronic component of claim 2, wherein the electrically insulative material comprises a polymeric material, a ceramic, a glassy material, or a blend of one or more of these.

4. The electronic component of claim 2, wherein the enclosure is a mold compound that encapsulates the power circuit, and wherein the electrically insulative material is less brittle than the mold compound.

5. The electronic component of claim 2, wherein the electrically insulative material extends into the gap.

6. The electronic component of claim 1,
- wherein the supply terminal to which the metallic body is attached and electrically coupled comprises:
  - a first main face;
  - a second main face opposite the first main face; and
  - a side face that extends between the first main face and the second main face and partly delimits the gap, and
- wherein the metallic body extends along at least one of the first main face, the second main face, or the side face.

7. The electronic component of claim 6, wherein the metallic body extends into the gap along the side face.

8. The electronic component of claim 7, wherein the metallic body extends from within the gap along the side face and beyond at least one of the first main face or the second main face.

9. The electronic component of claim 6,
- wherein a first part of the metallic body extends along one of the first main face, the second main face, or the side face, and
- wherein a second part of the metallic body extends along a different one of the first main face, the second main face, or the side face and adjoins the first part of the metallic body.

10. The electronic component of claim 9,
- wherein the first part of the metallic body extends into the gap along the side face, and
- wherein the second part of the metallic body extends along the first main face or the second main face and adjoins the first part of the metallic body.

11. The electronic component of claim 1, wherein the metallic body is disposed entirely above or below the positive supply terminal and the negative supply terminal, bridges the gap, and is electrically insulated from the one of the positive supply terminal or the negative supply terminal that the metallic body is not attached and electrically coupled to.

12. The electronic component of claim 1, further comprising:
- an additional metallic body separate from the metallic body,
- wherein the metallic body is attached and electrically coupled to the positive supply terminal,
- wherein the additional metallic body is attached and electrically coupled to the negative supply terminal, and
- wherein the additional metallic body extends along the positive supply terminal and the negative supply terminal in the longitudinal direction.

13. The electronic component of claim 12, further comprising:
- an electrically insulative material disposed between the metallic body and the additional metallic body in the gap.

14. The electronic component of claim 12,
- wherein each of the positive supply terminal and the negative supply terminal comprises:
  - a first main face;
  - a second main face opposite the first main face; and
  - a side face that extends between the first main face and the second main face and partly delimits the gap,
- wherein the side face of the positive supply terminal and the side face of the negative supply terminal face each other,
- wherein the metallic body extends along at least one of the first main face of the positive supply terminal, the second main face of the positive supply terminal, or the side face of the positive supply terminal, and
- wherein the additional metallic body extends along at least one of the first main face of the negative supply terminal, the second main face of the negative supply terminal, or the side face of the negative supply terminal.

15. The electronic component of claim 14,
- wherein at least a part of the metallic body extends into the gap along the side face of the positive supply terminal, and wherein at least a part of the additional metallic body extends into the gap along the side face of the negative supply terminal.

16. The packaged electronic component of claim 1, wherein the power circuit is a half-bridge or full-bridge circuit.

17. The packaged electronic component of claim 1, wherein the metallic body extends along the positive supply terminal and the negative supply terminal in the longitudinal direction outside the enclosure.

18. An electronic component, comprising:

an enclosure;

a power circuit disposed in the enclosure;

a positive supply terminal and a negative supply terminal each protruding outward from a first surface of the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit;

a first metallic body attached and electrically coupled to the positive supply terminal and extending along at least one face of the positive supply terminal in the longitudinal direction; and a second metallic body attached and electrically coupled to the negative supply terminal and extending along at least one face of the negative supply terminal in the longitudinal direction.

19. The electronic component of claim 18, further comprising an electrically insulative material disposed between the first metallic body and the second metallic body in the gap.

20. The electronic component of claim 18, wherein each of the first metallic body and the second metallic body extends into the gap.

21. An electronic component, comprising:

an enclosure;

a power circuit disposed in the enclosure;

a positive supply terminal and a negative supply terminal each protruding outward from a first surface of the enclosure, wherein the positive supply terminal and the negative supply terminal are separated from one another by a gap and extend adjacent to each other in a longitudinal direction, wherein the positive supply terminal is electrically coupled to a first terminal of the power circuit and the negative supply terminal is electrically coupled to a second terminal of the power circuit, wherein each of the positive supply terminal and the negative supply terminal comprises a first main face, a second main face opposite the first main face, and a side face that extends between the first main face and the second main face, wherein the side face of the positive supply terminal and the side face of the negative supply terminal face each other and delimit the gap; and a metallic body extending in the longitudinal direction along at least one of the first main face, the second main face, or the side face of each of the positive supply and the negative supply terminal.

22. The electronic component of claim 21, wherein the metallic body extends into the gap between and along the side face of the positive supply terminal and the side face of the negative supply terminal.

* * * * *